(12) United States Patent
Murase et al.

(10) Patent No.: US 10,879,347 B2
(45) Date of Patent: Dec. 29, 2020

(54) CAPACITOR

(71) Applicant: Murata Manufacturing Co., Ltd., Nagaokakyo (JP)

(72) Inventors: Yasuhiro Murase, Nagaokakyo (JP); Tomoyuki Ashimine, Nagaokakyo (JP); Hiroshi Nakagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/522,045

(22) Filed: Jul. 25, 2019

(65) Prior Publication Data

US 2019/0348496 A1 Nov. 14, 2019

Related U.S. Application Data

(63) Continuation of application No. PCT/JP2018/011500, filed on Mar. 22, 2018.

(30) Foreign Application Priority Data

Mar. 24, 2017 (JP) .................................. 2017-059875

(51) Int. Cl.
*H01L 23/00* (2006.01)
*H01L 49/02* (2006.01)
*H01L 21/283* (2006.01)
*H01G 4/33* (2006.01)
(Continued)

(52) U.S. Cl.
CPC ............... *H01L 28/91* (2013.01); *H01G 4/33* (2013.01); *H01L 21/283* (2013.01); *H01L 23/5223* (2013.01); *H01L 27/0805* (2013.01); *H01L 28/75* (2013.01)

(58) Field of Classification Search
None
See application file for complete search history.

(56) References Cited

U.S. PATENT DOCUMENTS 7,626,802 B2   12/2009  Oh
8,203,823 B2   6/2012   Oh
9,455,151 B2   9/2016   Bauer et al.
(Continued)

FOREIGN PATENT DOCUMENTS

JP   2003045739 A   2/2003
JP   2004165557 A   6/2004
(Continued)

OTHER PUBLICATIONS

International Search Report issued in PCT/JP2018/011500, dated May 29, 2018.
(Continued)

*Primary Examiner* — Reema Patel
(74) *Attorney, Agent, or Firm* — Arent Fox LLP

(57) ABSTRACT

A capacitor that includes a first capacitor layer having a first substrate provided with a first trench structure having a trench, a first electrode, and a second electrode provided in a region of the first trench structure that includes a trench, and a second capacitor layer having a second substrate, a third electrode, and a fourth electrode. Moreover, the first capacitor layer and the second capacitor layer are disposed such that the second electrode and the third electrode oppose each other and are electrically connected.

17 Claims, 11 Drawing Sheets

(51) Int. Cl.
H01L 27/08 (2006.01)
H01L 23/522 (2006.01)

(56) References Cited

U.S. PATENT DOCUMENTS

| | | |
|---|---|---|
| 2009/0103235 A1 | 4/2009 | Oh |
| 2009/0180239 A1 | 7/2009 | Oh |
| 2013/0063863 A1* | 3/2013 | Timler ............... F22B 1/28 |
| | | 361/313 |
| 2015/0145103 A1 | 5/2015 | Chou et al. |
| 2015/0145104 A1 | 5/2015 | Bauer et al. |
| 2016/0268144 A1 | 9/2016 | Voiron |
| 2017/0053979 A1* | 2/2017 | Voiron ............. H01L 29/66181 |

FOREIGN PATENT DOCUMENTS

| | | |
|---|---|---|
| JP | 2009105369 A | 5/2009 |
| JP | 2009170861 A | 7/2009 |
| JP | 2010050177 A | 3/2010 |
| JP | 2015111671 A | 6/2015 |
| JP | 2016058618 A | 4/2016 |
| JP | 2016535441 A | 11/2016 |

OTHER PUBLICATIONS

Written Opinion of the International Searching Authority issued in PCT/JP2018/011500, dated May 29, 2018.

* cited by examiner

US 10,879,347 B2

CAPACITOR

CROSS REFERENCE TO RELATED APPLICATIONS

The present application is a continuation of PCT/JP2018/011500 filed Mar. 22, 2018, which claims priority to Japanese Patent Application No. 2017-059875, Mar. 24, 2017, the entire contents of each of which are incorporated herein by reference.

TECHNICAL FIELD

The present disclosure relates to a capacitor.

BACKGROUND

High density integration of electronic components mounted on a substrate are needed for miniaturization and high functionality of electronic devices. Also for a capacitor, in order to increase capacitance while maintaining or reducing an occupied area, for example, a configuration of a trench capacitor as described Patent Document 1 (identified below) has been studied.

Specifically, Patent Document 1 discloses a structure of an improved capacitor including a substrate, a metal layer disposed above the substrate to form a pore insulating matrix, and a metal-insulator-metal capacitor formed on the metal layer and inside the pore insulating matrix. Further, Patent Document 1 discloses a configuration in which two metal-insulator-metal capacitors are connected with a trench surface turned upward. With this configuration, it is possible to connect electrodes of the two capacitors so that the capacitors are connected in parallel, and to increase a capacitance value per unit area.

Such capacitors, which are active elements, are mounted on a circuit board together with active elements such as Si-IGBTs to constitute a module having various functions. At that time, for example, wire bonding, solder, or the like is used to obtain an electrical connection of the elements. For wire bonding, for example, in a power module, a thick aluminum wire, an aluminum ribbon, or a copper wire is used.

Patent Document 1: PCT International Application Publication No. 2016-535441.

However, when wire bonding, ball bonding, or the like is performed on a capacitor having a trench structure, the trench structure may be cracked by a pressure at a time of bonding, which may cause deterioration in reliability. On the other hand, if a bonding pad region is provided so as to avoid the trench structure, the area of a capacitance forming portion is reduced and capacitance density is lowered. Particularly when bonding with a member requiring a strong pressure at a time of bonding, such as a copper wire or an aluminum thick wire preferably used for bonding to a high withstand voltage capacitor used in a power module, the trench structure is damaged by the strong pressure, and deterioration of electrical characteristics and reliability becomes significant.

SUMMARY OF THE INVENTION

The exemplary embodiments of the present invention have been made in view of such circumstances. Specifically, it is an object thereof to provide a capacitor configured for suppressing deterioration of electrical characteristics and reliability.

In one exemplary aspect, a capacitor is provided that includes a first capacitor layer having a first substrate that has a first main surface and a second main surface opposing each other and is provided with a first trench structure having a trench portion in the second main surface, a first electrode provided on a side of the first main surface of the first substrate, and a second electrode provided in a region of the first trench structure that includes the trench portion on a side of the second main surface of the first substrate. Moreover, the capacitor includes a second capacitor layer having a second substrate that has a third main surface and a fourth main surface opposing each other, a third electrode provided on a side of the third main surface of the second substrate, and a fourth electrode provided on a side of the fourth main surface of the second substrate. In this aspect, the first capacitor layer and the second capacitor layer are disposed such that the second electrode and the third electrode oppose each other and are electrically connected.

A capacitor according to another exemplary aspect includes a first capacitor layer, a second capacitor layer, and at least one intermediate capacitor layer located between the first capacitor layer and the second capacitor layer. The first capacitor layer includes a first substrate that has a first main surface and a second main surface opposing each other and is provided with a first trench structure having a trench portion in the second main surface, a first electrode provided on a side of the first main surface of the first substrate, and a second electrode provided in a region of the first trench structure that includes the trench portion on a side of the second main surface of the first substrate. Moreover, the second capacitor layer includes a second substrate that has a third main surface and a fourth main surface opposing each other and is provided with a second trench structure having a trench portion in the third main surface, a third electrode provided in a region of the second trench structure that includes the trench portion on a side of the third main surface of the second substrate, and a fourth electrode provided on a side of the fourth main surface of the second substrate. The intermediate capacitor layer includes a third substrate that has a fifth main surface and a sixth main surface opposing each other and is provided with a third trench structure having a trench portion in the fifth main surface and is provided with a fourth trench structure having a trench portion in the sixth main surface, a fifth electrode provided in a region of the third trench structure that includes the trench portion on a side of the fifth main surface of the third substrate, and a sixth electrode provided in a region of the fourth trench structure that includes the trench portion on a side of the sixth main surface of the third substrate. According to the exemplary aspect, the first capacitor layer and the intermediate capacitor layer are disposed such that the first trench structure and the third trench structure oppose each other, and the second capacitor layer and the intermediate capacitor layer are disposed such that the second trench structure and the fourth trench structure oppose each other.

According to the exemplary embodiments of the present invention, a capacitor is provided that is configured to suppress deterioration of electrical characteristics and reliability. For example, when wire bonding is performed on a capacitor, there is no trench structure on the surface to be wire bonded, thus even when bonding is performed with a member requiring a strong pressure at a time of bonding, there is no damage to the trench structure due to the strong pressure, and it is possible to suppress deterioration of electrical characteristics and reliability.

DETAILED DESCRIPTION

Figure 1:
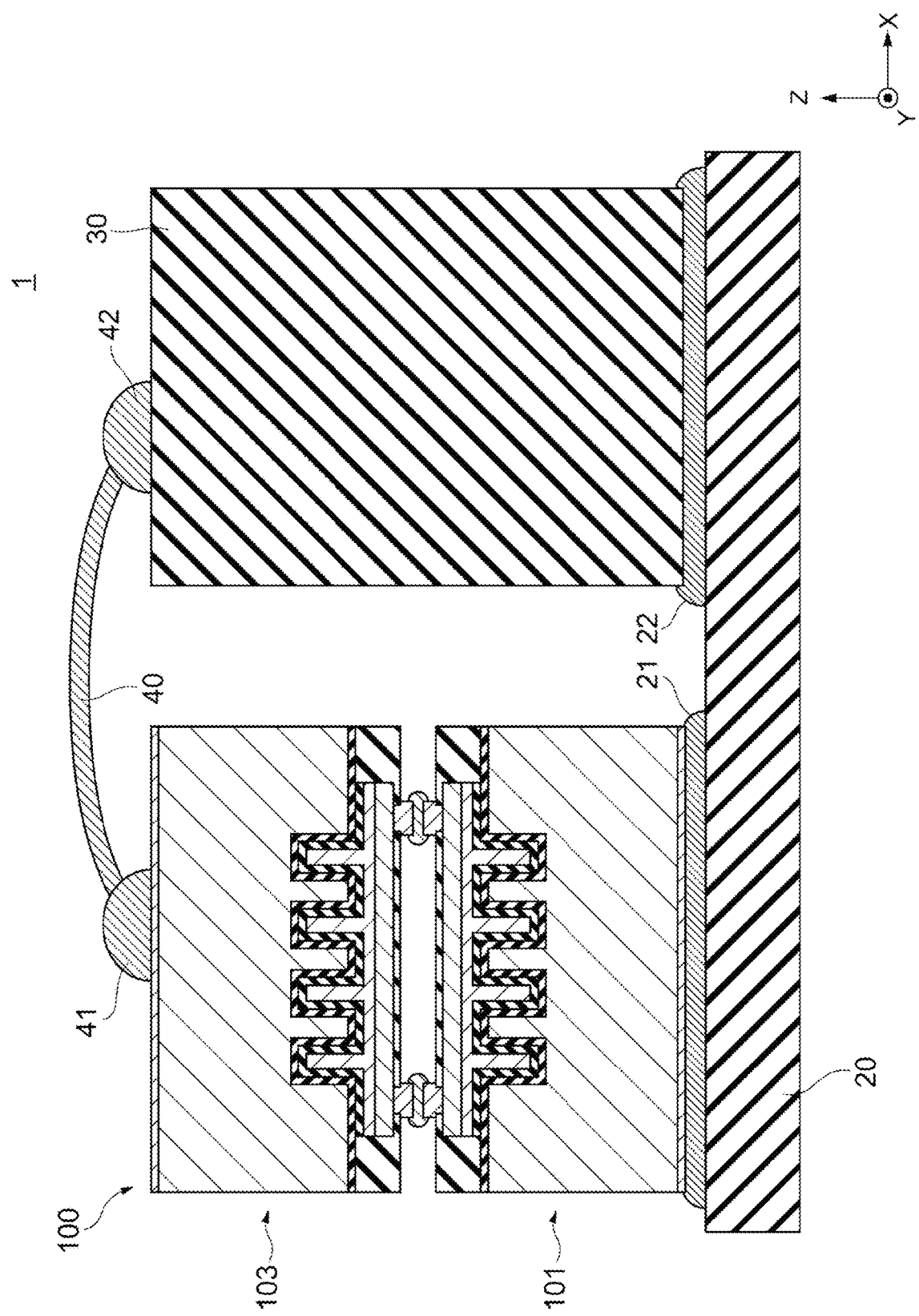
FIG. 1 is a cross-sectional view schematically illustrating an electronic device on which a capacitor is mounted according to a first exemplary embodiment of the present invention.

Hereinafter, exemplary embodiments of the present invention will be described. In descriptions of the drawings below, the same or similar components are denoted by the same or similar reference numerals. Descriptions of similar configurations will be omitted. The drawings are illustrative, the dimensions and shapes of respective parts are schematic, and the technical scope of the present invention should not be interpreted as being limited to the exemplary embodiments.

In the following description, a first direction X, a second direction Y, and a third direction Z are, for example, directions orthogonal to each other but are not particularly limited as long as the directions intersect each other, and may be directions to intersect at angles other than perpendicular to each other. It is noted that in the present description, a main surface is a surface parallel to a surface identified by the first direction X and the second direction Y (hereinafter referred to as an XY surface).

First Embodiment

Figure 2:
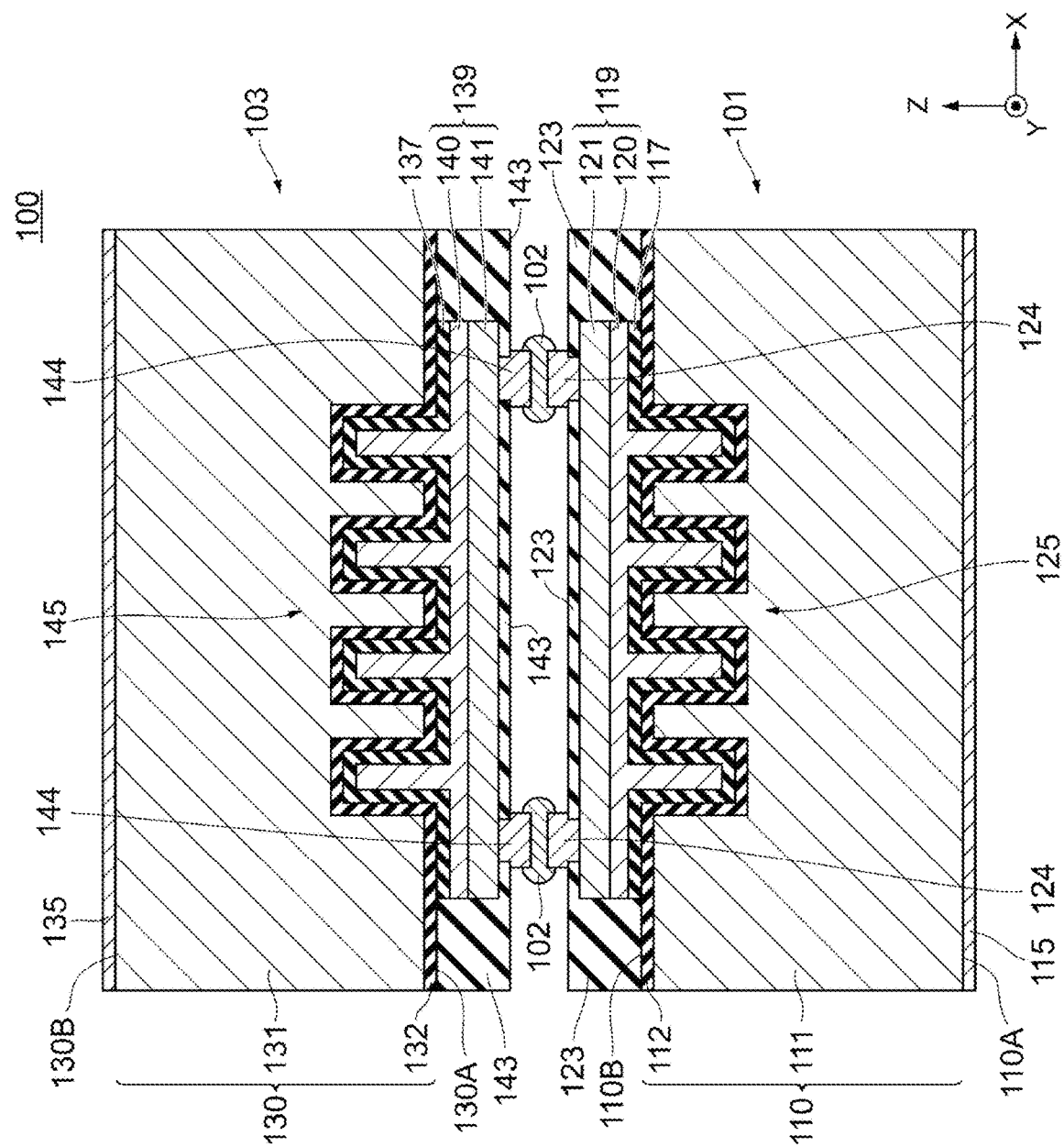
FIG. 2 is a cross-sectional view schematically illustrating a configuration of the capacitor according to the first exemplary embodiment.
Figure 3:
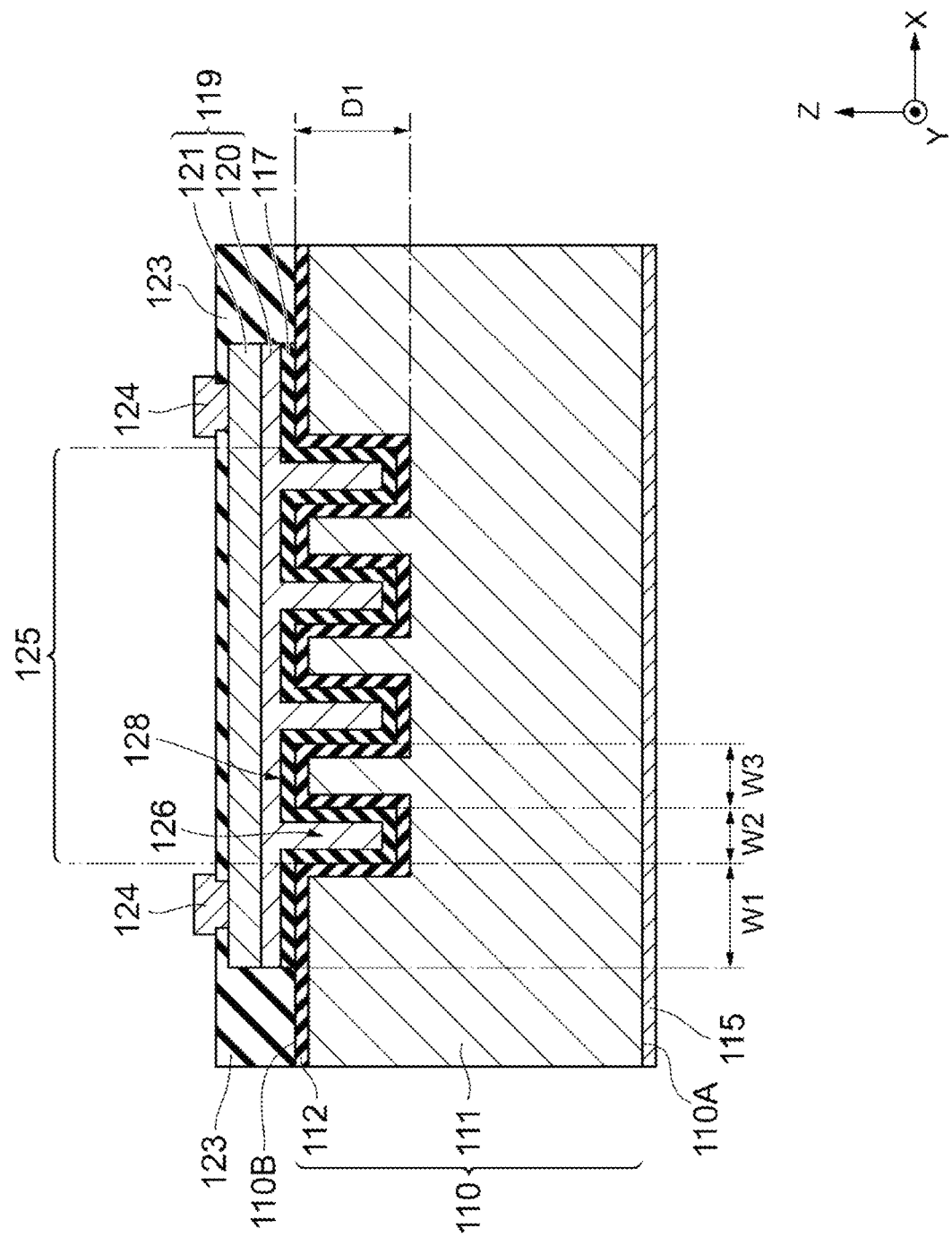
FIG. 3 is a cross-sectional view schematically illustrating a configuration of a first capacitor layer of the capacitor according to the first exemplary embodiment.
Figure 4:
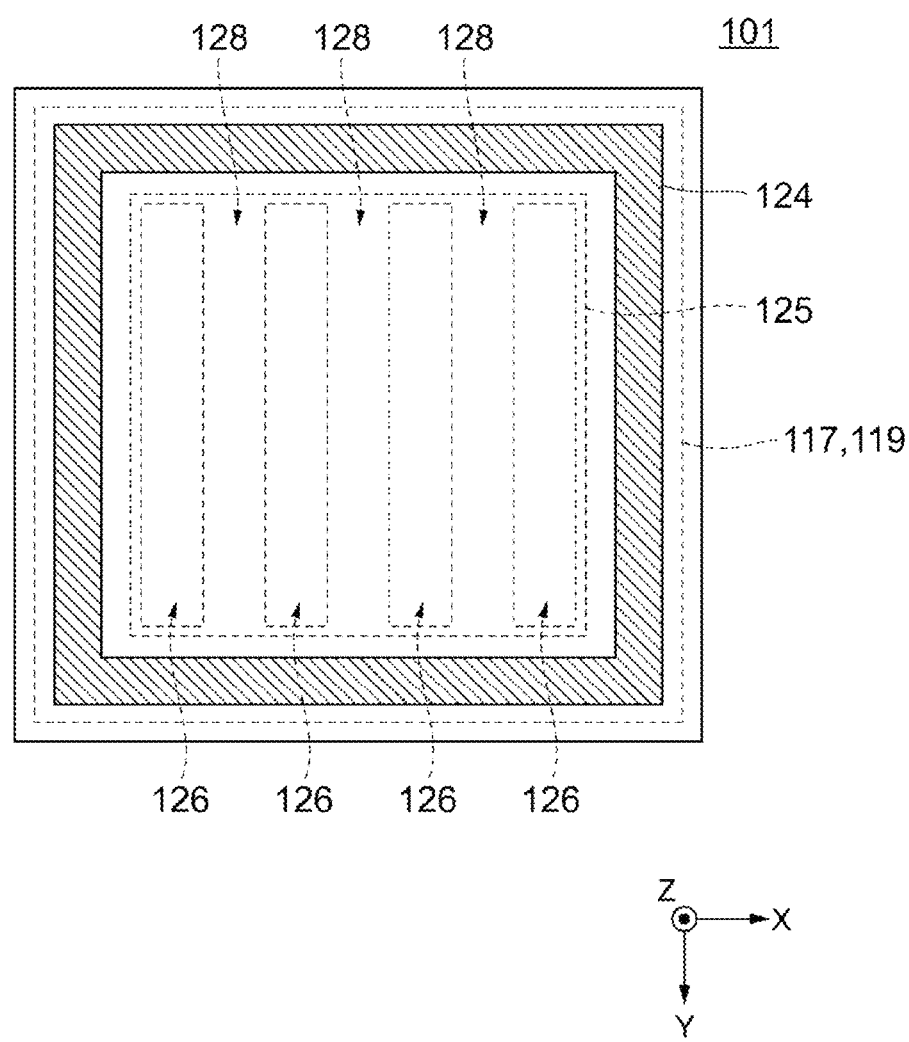
FIG. 4 is a plan view schematically illustrating the configuration of the first capacitor layer of the capacitor according to the first exemplary embodiment.

A configuration of a capacitor 100 according to a first exemplary embodiment will be described with reference to FIGS. 1 to 4. In particular, FIG. 1 is a cross-sectional view schematically illustrating an electronic device on which the capacitor according to the first exemplary embodiment is mounted. FIG. 2 is a cross-sectional view schematically illustrating a configuration of the capacitor according to the first embodiment. FIG. 3 is a cross-sectional view schematically illustrating a configuration of a first capacitor layer of the capacitor according to the first embodiment. FIG. 4 is a plan view schematically illustrating the configuration of the first capacitor layer of the capacitor according to the first embodiment.

As shown, an electronic device 1 includes a base member 20, the capacitor 100, and an electronic component 30. The capacitor 100 is disposed on the base member 20 and electrically connected to the base member 20 by a bonding member 21. The electronic component 30 is disposed on the base member 20 so as to be aligned with the capacitor 100, and is electrically connected to the base member 20 by a bonding member 22. The capacitor 100 and the electronic component 30 are bonded to each other by a wire 40 on sides opposite to sides opposing the base member 20. It is noted that a junction point 41 provided between the capacitor 100 and the wire 40 is not particularly limited in position on the capacitor 100.

The capacitor 100 includes a first capacitor layer 101 and a second capacitor layer 103 overlapping in the third direction Z. The first capacitor layer 101 is located on a side closer to the base member 20 with respect to the second capacitor layer 103.

First, a structure of the first capacitor layer 101 will be described, for example, as shown in FIG. 2. The first capacitor layer 101 includes a first substrate 110, a first electrode 115, a first dielectric film 112, a second dielectric film 117, a second electrode 119, and a protective insulating film 123.

The first substrate 110 includes a first main surface 110A and a second main surface 110B opposing each other in the third direction Z. The first main surface 110A is located on a side opposing the base member 20 and formed in a planar shape. The second main surface 110B is located on a side opposing the second capacitor layer 103, and a first trench structure 125 is formed in a center portion of the second main surface 110B. The first substrate 110 has, for example, a silicon substrate 111.

The silicon substrate 111 forms the first main surface 110A. According to the exemplary aspect, the silicon substrate 111 is formed of an Si (silicon) based material. For example, the silicon substrate 111 is formed of n-type Si or p-type Si having conductivity. When the silicon substrate 111 has conductivity, the silicon substrate 111 can combine a function of a first electrode 115, which will be described later. For example, a thickness of the silicon substrate 111 is approximately 680 μm.

The material of the first substrate 110 is not limited to the silicon substrate 111. For example, the first substrate 110 may be formed of an insulating substrate made of silicon oxide, a conductive substrate other than silicon, or the like. In addition, the first substrate 110 is not limited to a single-layer structure, and may have a multilayer structure of two or more layers.

Referring to FIG. 3, for example, the first trench structure 125 has at least one trench (a trench portion 126) formed in the third direction Z with respect to the silicon substrate 111. In the example illustrated in FIG. 3, the first trench structure 125 has four trench portions 126 aligned in the first direction X, and three regions 128 located between the trench portions 126. The number of trench portions 126 is not limited to that described above, and may be five or more, or three or less. Further, as illustrated in FIG. 4, the trench portions 126 are formed, for example, along the second direction Y. In addition, the shape and the arrangement of the trench portions 126 of the first trench structure 125 are not particularly limited. For example, in order to further increase capacitance density per unit area, cylindrical trench portions may be arranged in a matrix in the first direction X and the second direction Y in plan view from a normal direction of the second main surface 110B.

The first dielectric film 112 covers a surface on a side of the second electrode 119 of the silicon substrate 111, and forms the second main surface 110B. The first dielectric film 112 is formed of, for example, an insulating silicon oxide (for example, $SiO_2$). The first dielectric film 112 is formed by oxidizing the silicon substrate 111 by a method such as thermal oxidation. The first dielectric film 112 functions as a dielectric of the capacitor together with the second dielectric film 117 in a region where the second electrode 119 is present. For example, a thickness of the first dielectric film 112 is approximately 0.3 μm.

The first dielectric film 112 is disposed along the first trench structure 125 and is also formed inside the trench portions 126. The trench portions 126 of the first trench structure 125 are formed by, for example, dry etching the silicon substrate 111. As illustrated in FIG. 3, a depth D1 of the trench portion 126 in the third direction Z is, for example, 10 μm or more and 50 μm or less. A width W2 of the trench portion 126 in the first direction X is, for example, approximately 5 μm, and a width W3 of the region 128 between the trench portions 126 in the first direction X is, for example, approximately 3 μm.

The second dielectric film 117 is provided on the second main surface 110B (i.e., a side of the first dielectric film 112 opposing the second capacitor layer 103) and in the trench portions 126 of the first trench structure 125, and is provided between the first substrate 110 and the second electrode 119. The second dielectric film 117 extends to an outside of the first trench structure 125 in plan view from the normal direction (positive direction side in the third direction Z) of the second main surface 110B. A width W1 in the first direction X from an end of the first trench structure 125 to an end of the second dielectric film 117 is, for example, 50 μm or more and 200 μm or less. A thickness of the second dielectric film 117 is, for example, approximately 1 μm. The second dielectric film 117 is formed of a dielectric material such as silicon oxynitride (SiON) or silicon nitride ($Si_3N_4$). The second dielectric film 117 is formed by, for example, chemical vapor deposition (CVD) or the like. Further, when the second dielectric film 117 is formed of a dielectric having a dielectric constant higher than that of a material included in the first substrate 110, the capacitance density can be increased further. The second dielectric film 117 may have not only a single layer but also a stacked structure of a plurality of dielectrics. In this manner, more arbitrary capacitance and withstand voltage design become possible.

In the exemplary aspect, the first electrode 115 covers the first main surface 110A and is electrically connected to the bonding member 21. The first electrode 115 is formed of, for example, a metal material such as molybdenum (Mo), aluminum (Al), gold (Au), tungsten (W), platinum (Pt), titanium (Ti), or the like. These metal materials can be formed by sputtering, vacuum evaporation, or the like. In addition, the material of the first electrode 115 is not limited to a metal material as long as it is a conductive material, and the first electrode 115 may be formed of a conductive resin or the like. The first electrode 115 need not necessarily be formed on the entire surface of the first main surface 110A, and may be formed at least in a region opposing the second electrode 119 in the third direction Z.

The second electrode 119 is provided on the second dielectric film 117 (a side of the second dielectric film 117 opposing the second capacitor layer 103) and in the trench portion 126 of the first trench structure 125. Further, the second electrode 119 extends to the outside of the first trench structure 125 in plan view from the normal direction of the second main surface 110B. The second electrode 119 is electrically separated from the first electrode 115 and opposes the first electrode 115 in the third direction Z.

The second electrode 119 has a first conductive film 120 and a second conductive film 121. The first conductive film 120 is provided on the second dielectric film 117 (the side of the second dielectric film 117 opposing the second capacitor layer 103) and in the trench portions 126 of the first trench structure 125. The second conductive film 121 is provided on the first conductive film 120 (a side of the first conductive film 120 opposing the second capacitor layer 103).

The first conductive film 120 is formed of, for example, a conductive material such as p-type or n-type polycrystalline Si (polysilicon) and is in contact with the second dielectric film 117. A thickness of the first conductive film 120 is, for example, approximately 0.5 μm. In addition, if close contact between the second dielectric film 117 and the second conductive film is sufficiently high and forming with a high coverage is possible on the second dielectric film in the trench portion 126, the first conductive film 120 may be omitted, and the second conductive film 121 may be provided directly on the second dielectric film 117.

The second conductive film 121 is formed of, for example, a metal material such as molybdenum (Mo), aluminum (Al), gold (Au), tungsten (W), platinum (Pt), titanium (Ti), or the like. It is noted that the material of the second conductive film 121 is not limited to the metal material as long as it is a conductive material, and the second conductive film 121 may be formed of a conductive resin or the like.

As further shown, the protective insulating film 123 covers the second electrode 119. Further, the protective insulating film 123 desirably covers the second dielectric film 117 and an end thereof, and desirably covers a portion of the second main surface 110B that is not covered by the second dielectric film 117. The protective insulating film 123 may have a dielectric constant lower or higher than that of the second dielectric film 117. According to an exemplary aspect, the protective insulating film 123 desirably has a compressive stress on the first substrate 110 when the second dielectric film 117 has a tensile stress on the first substrate 110. That is, the protective insulating film 123 preferably has a stress that reduces the stress of the second dielectric film 117 to the first substrate 110. The protective insulating film 123 is formed of, for example, polyimide or the like, and has a thickness of approximately 30 μm.

As further shown, a connection electrode 124 is provided that penetrates the protective insulating film 123 in the third direction Z, and is electrically connected to the second electrode 119. The connection electrode 124 is separated from the first trench structure 125 and overlaps the second electrode 119 in plan view from the normal direction of the second main surface 110B. As illustrated in FIG. 4, the connection electrode 124 is formed in, for example, a rectangular shape so as to be located outside the first trench structure 125.

Next, a structure of the second capacitor layer 103 will be described. The second capacitor layer 103 has a vertically symmetrical structure (in the third direction Z) with respect to the first capacitor layer 101, and the first capacitor layer 101 and the second capacitor layer 103 are stacked such that the first trench structure 125 and a second trench structure 145 oppose each other.

The second capacitor layer 103 includes a second substrate 130, a third electrode 139, a third dielectric film 132, a fourth dielectric film 137, a protective insulating film 143, and a fourth electrode 135. In respective portions of the second capacitor layer 103, similar configurations to the respective portions of the first capacitor layer 101 are described as similar ones, and descriptions thereof are omitted as appropriate.

The second substrate 130 includes a third main surface 130A and a fourth main surface 130B that oppose each other in the third direction Z. The third main surface 130A is located on a side opposing the first capacitor layer 101, and the second trench structure 145 is formed in a center portion of the third main surface 130A. The fourth main surface 130B is located on a side opposing the wire 40 and is formed in a planar shape. The second trench structure 145 has a similar configuration to the first trench structure 125.

The second substrate 130 has a silicon substrate 131. The silicon substrate 131 forms the fourth main surface 130B. The third dielectric film 132 forms the third main surface 130A. The silicon substrate 131 and the third dielectric film 132 have similar configurations to the silicon substrate 111 and the first dielectric film 112, respectively.

The fourth electrode 135 covers the fourth main surface 130B and is electrically connected to the wire 40. The fourth electrode 135 corresponds to a bonding pad of the capacitor 100 for the wire 40. The fourth electrode 135 has a similar configuration to the first electrode 115. The junction point 41 with the wire 40 provided on the fourth electrode 135 is not limited in position, and may be positioned to oppose the first trench structure 125 and the second trench structure 145 in the third direction Z.

As further shown, the fourth dielectric film 137 is provided under the third main surface 130A (a side of the third dielectric film 132 opposing the first capacitor layer 101) and in a trench portion of the second trench structure 145, and is provided between the second substrate 130 and the third electrode 139. The fourth dielectric film 137 extends to an outside of the second trench structure 145 in plan view from a normal direction (a negative direction side in the third direction Z) of the third main surface 130A. The fourth dielectric film 137 has a similar configuration to the second dielectric film 117.

Moreover, the third electrode 139 is provided under the fourth dielectric film 137 (a side of the fourth dielectric film 137 opposing the first capacitor layer 101) and in the trench portion of the second trench structure 145. Further, the second electrode 119 extends to the outside of the second trench structure 145 in plan view from the normal direction of the third main surface 130A. The second electrode 119 is electrically separated from the first electrode 115 and opposes the first electrode 115 in the third direction Z.

The third electrode 139 has a third conductive film 140 and a fourth conductive film 141. The third conductive film 140 is provided on the fourth dielectric film 137 (the side of the fourth dielectric film 137 opposing the first capacitor layer 101) and in the trench portion of the second trench structure 145. The second conductive film 121 is provided on the first conductive film 120 (a side of the first conductive film 120 opposing the second capacitor layer 103). The third conductive film 140 and the fourth conductive film 141 have similar configurations to the first conductive film 120 and the second conductive film 121, respectively.

The protective insulating film 143 covers the third electrode 139. Further, the protective insulating film 143 desirably covers the fourth dielectric film 137 and an end thereof, and desirably covers a portion of the third main surface 130A that is not covered by the fourth dielectric film 137. Thus, in the exemplary aspect, protective insulating film 143 has a similar configuration to the protective insulating film 123.

The connection electrode 144 is provided to penetrate the protective insulating film 143 in the third direction Z, and is electrically connected to the third electrode 139. Moreover, the connection electrode 144 is separated from the second trench structure 145 in plan view from the normal direction of (i.e., parallel to) the third main surface 130A. The connection electrode 144 has a similar configuration to the connection electrode 124.

According to the exemplary aspect, the connection electrode 124 and the connection electrode 144 are electrically connected by a brazing member 102. That is, the second electrode 119 and the third electrode 139 are electrically connected. Further, the first capacitor layer 101 and the second capacitor layer 103 are fixed to each other by the brazing member 102. The brazing member 102 is formed in a fillet shape so as to surround projecting portions of the connection electrode 124 and the connection electrode 144. Thus, bonding strength and conductivity of the connection electrode 124 and the connection electrode 144 are improved. In addition, although the brazing member 102 is a member used when the connection electrode 124 and the connection electrode 144 are soldered with each other, bonding of the connection electrode 124 and the connection electrode 144 is not limited to soldering. For example, the connection electrode 124 and the connection electrode 144 may be bonded by a conductive adhesive (adhesive), or may be directly bonded by welding or the like.

The configuration of the capacitor 1 in which the trench structures are formed to oppose each other on both the second main surface 110B of the first capacitor layer 101 and the third main surface 130A of the second capacitor layer 103 has been described above as the first embodiment. However, the capacitor according to the embodiment is not limited to the above configuration, and it will suffice if the trench structure is formed in at least one of the second main surface and the third main surface. For example, in the capacitor, the trench structure may be formed in the second main surface of the first capacitor layer, and the third main surface of the second capacitor layer may be formed flat. That is, the capacitor may be one provided with a trench type first capacitor layer and a planar type second capacitor layer disposed to cover the trench structure of the first capacitor layer. In addition, the planar type capacitor is a capacitor in which a pair of electrodes forming a capacitance is provided in a planar shape. According to this aspect, the second capacitor layer can be provided using part of a semiconductor element such as a diode or a transistor, for example, a depletion layer region. Further, in the capacitor, the trench structure may be formed in the third main surface of the second capacitor layer, and the second main surface of the first capacitor layer may be formed flat.

Hereinafter, additional exemplary embodiments will be described with reference to FIGS. 5 to 11. It is noted that in the drawings referred to in the following description of embodiments, illustrations of the same or similar configurations as those in the drawings referred to in the description of the first embodiment are omitted as appropriate. Further, in the following description of exemplary embodiments, descriptions of the same or similar configurations as those of the first embodiment are also omitted.

Second Embodiment

Figure 5:
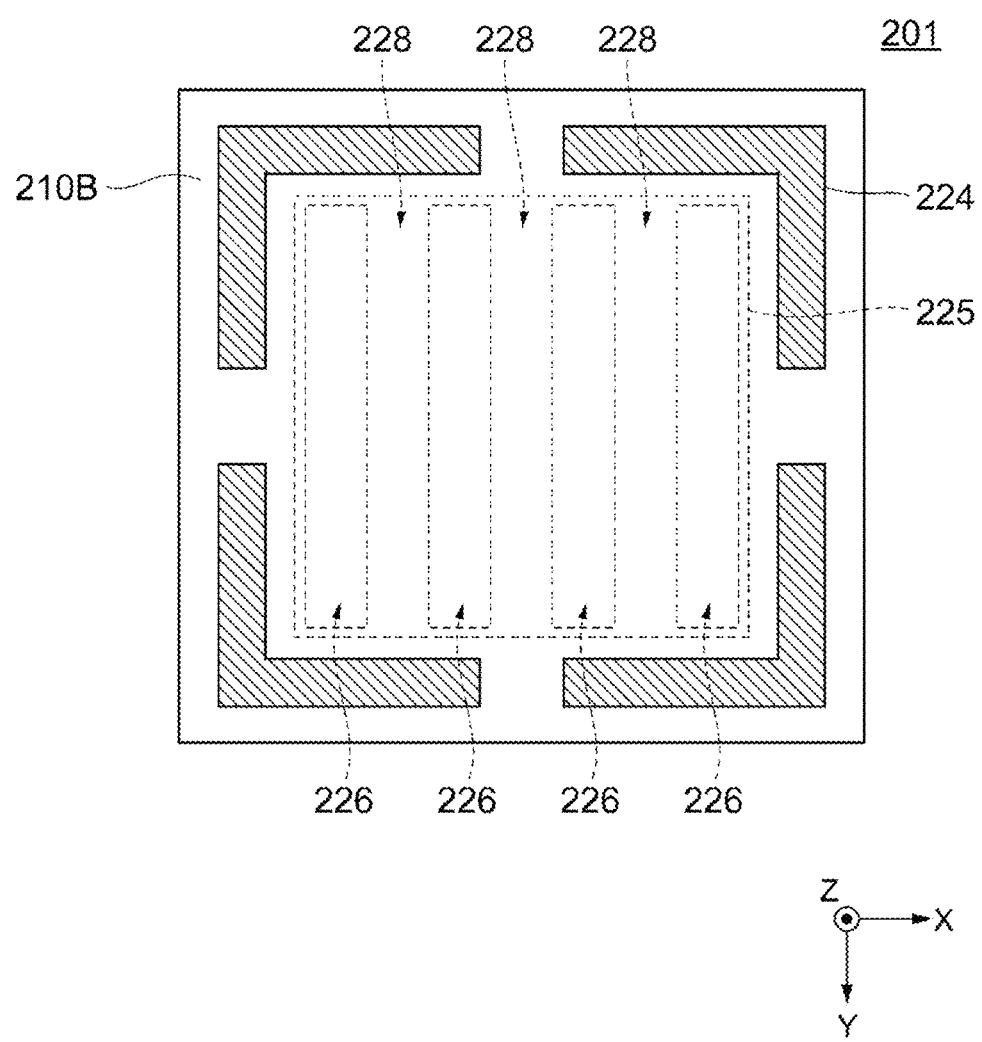
FIG. 5 is a plan view schematically illustrating a configuration of a first capacitor layer of a capacitor according to a second exemplary embodiment.

Next, a configuration of a first capacitor layer 201 of a capacitor according to a second exemplary embodiment will be described with reference to FIG. 5. FIG. 5 is a plan view schematically illustrating a configuration of a first capacitor layer of the capacitor according to the second embodiment.

As shown, the first capacitor layer 201 of the second embodiment is different from the first capacitor layer 101 of the first embodiment illustrated in FIG. 4 in that a connection electrode 224 is formed in a plurality of island shapes so as to surround a first trench structure 225 in plan view from a normal direction of a second main surface 210B. Specifically, the connection electrode 224 is formed in a discontinuous frame shape so as to surround the first trench structure 225.

Third Embodiment

Figure 6:
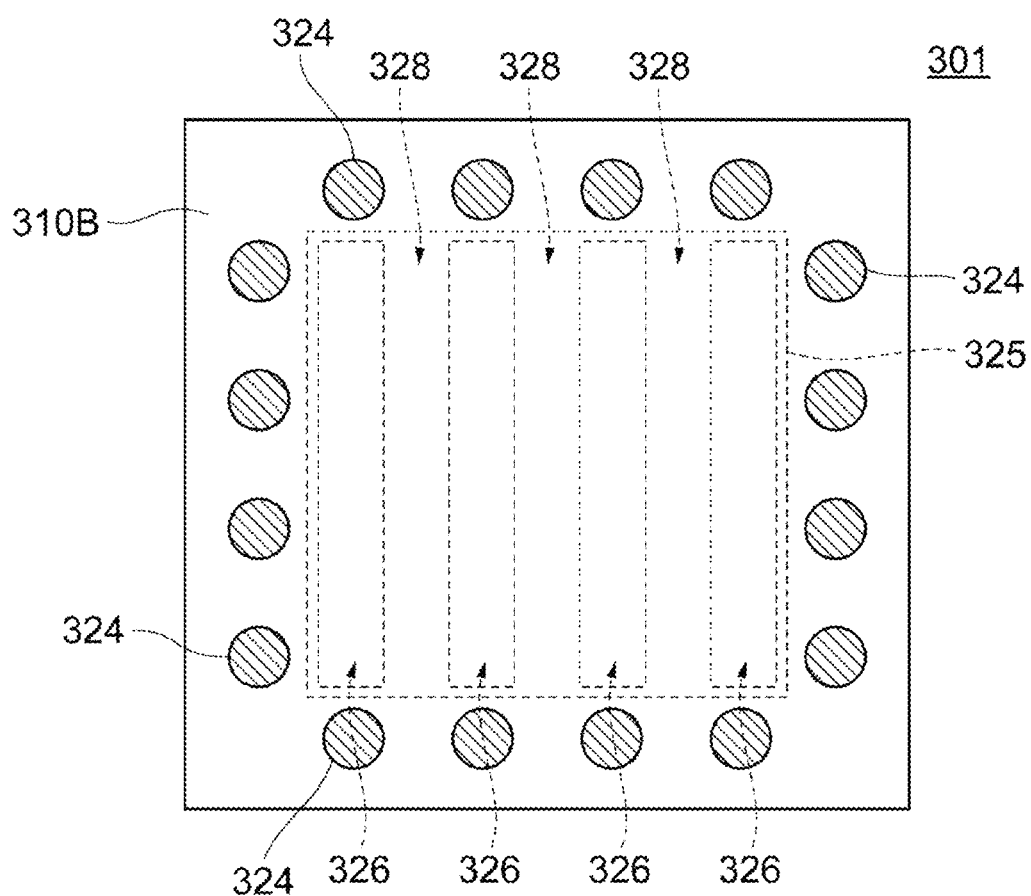
FIG. 6 is a plan view schematically illustrating a configuration of a first capacitor layer of a capacitor according to a third exemplary embodiment.

Next, a configuration of a first capacitor layer 301 of a capacitor according to a third exemplary embodiment will be described with reference to FIG. 6. FIG. 6 is a plan view schematically illustrating a configuration of a first capacitor layer of the capacitor according to the third embodiment.

The first capacitor layer 301 of the third embodiment is different from the first capacitor layer 101 of the first embodiment illustrated in FIG. 4 in that a connection electrode 324 is formed in a plurality of island shapes so as to surround a first trench structure 325. Specifically, the connection electrode 324 is formed in a plurality of columnar shapes so as to surround the first trench structure 325. The shape of the connection electrode 324 may be cylindrical (elliptical cylindrical) or prismatic.

Fourth Embodiment

Figure 7:
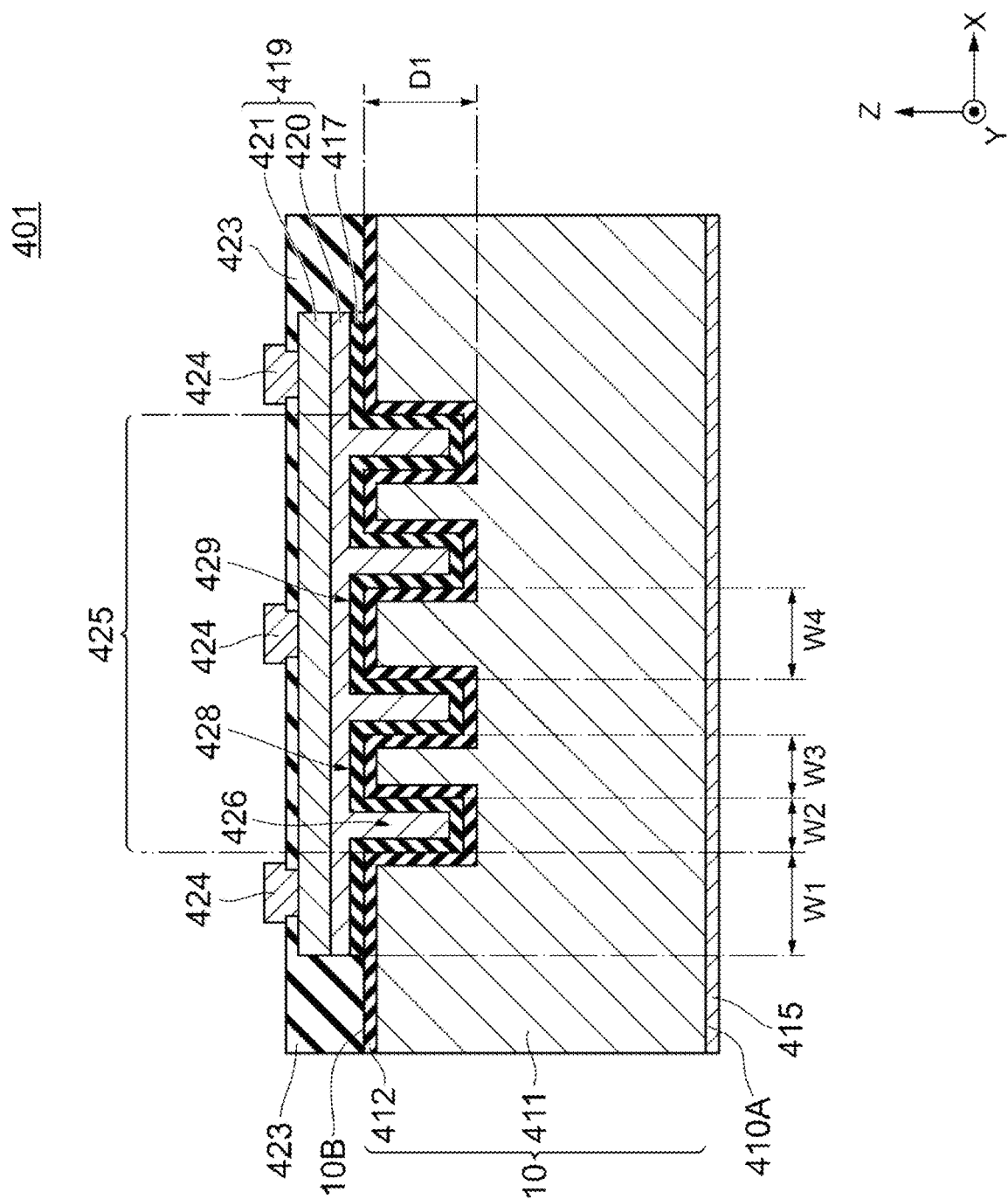
FIG. 7 is a cross-sectional view schematically illustrating a configuration of a first capacitor layer of a capacitor according to a fourth exemplary embodiment.
Figure 8:
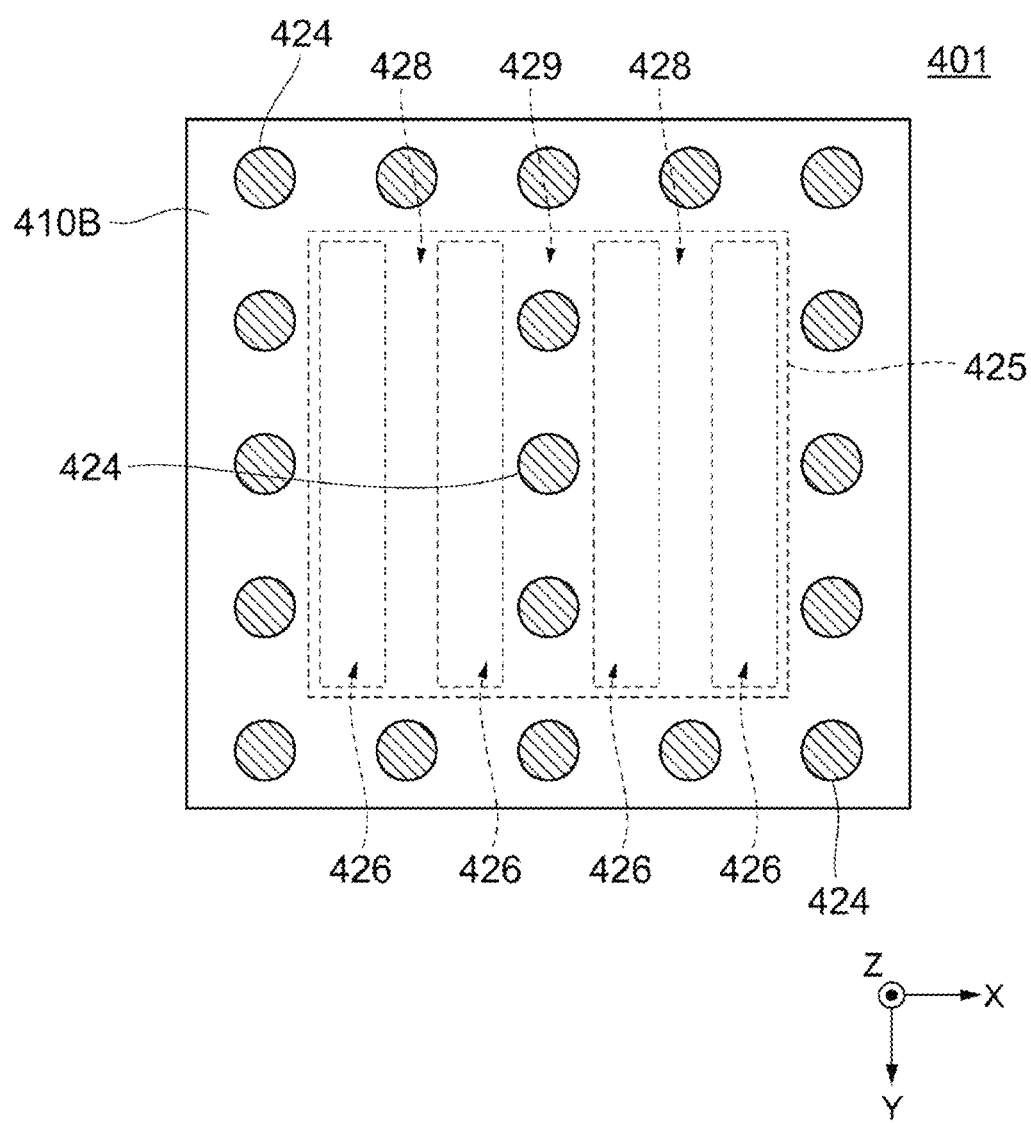
FIG. 8 is a plan view schematically illustrating the configuration of the first capacitor layer of the capacitor according to the fourth exemplary embodiment.

Next, a configuration of a first capacitor layer 401 of a capacitor according to a fourth exemplary embodiment will be described with reference to FIGS. 7 and 8. FIG. 7 is a cross-sectional view schematically illustrating a configuration of a first capacitor layer of the capacitor according to the fourth embodiment. FIG. 8 is a plan view schematically illustrating the configuration of the first capacitor layer of the capacitor according to the fourth embodiment.

In this aspect, the first capacitor layer 401 of the fourth embodiment is different from the first capacitor layer 301 of the third embodiment illustrated in FIG. 6 in that a first trench structure 425 includes a first region 428 and a second region 429 sandwiched by trench portions 426. Further, it is also different in that a connection electrode 424 is provided so as to oppose the second region 429 in the third direction Z.

The first region 428 is a planar region provided between the trench portions 426, and a width thereof in the first direction X is W3. The second region 429 is also a planar region provided between the trench portions 426, but a width thereof in the first direction X is W4 different from the width W3 of the first region 428. The width W4 is larger than the width W3. The width W4 is, for example, approximately 20 µm. The width W4 is larger than a width of the connection electrode 424 provided above the second region 429.

Fifth Embodiment

Figure 9:
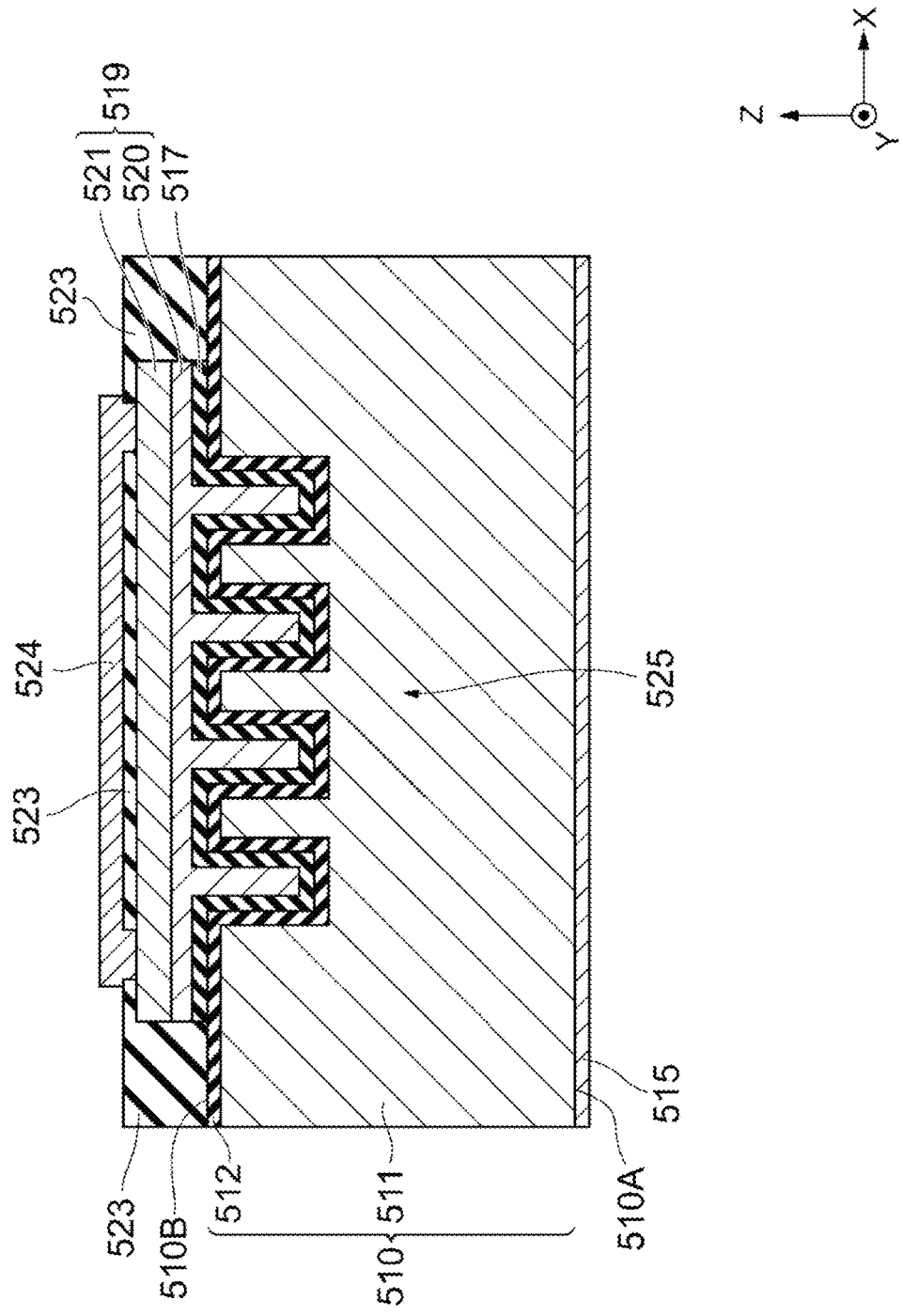
FIG. 9 is a plan view schematically illustrating a configuration of a first capacitor layer of a capacitor according to a fifth exemplary embodiment.

Next, a configuration of a first capacitor layer 501 of a capacitor according to a fifth exemplary embodiment will be described with reference to FIG. 9. FIG. 9 is a cross-sectional view schematically illustrating a configuration of a first capacitor layer of the capacitor according to the fifth embodiment.

The first capacitor layer 501 of the fifth embodiment is different from the first capacitor layer 101 of the first embodiment illustrated in FIG. 3 in that a connection electrode 524 is provided to oppose a first trench structure 525 in the third direction Z. Specifically, the connection electrode 524 is provided also on the protective insulating film 523. In addition, the connection electrode 524 may have a multilayer structure having a member provided so as to penetrate the protective insulating film 523 and a member provided so as to cover the protective insulating film 523.

Sixth Embodiment

Figure 10:
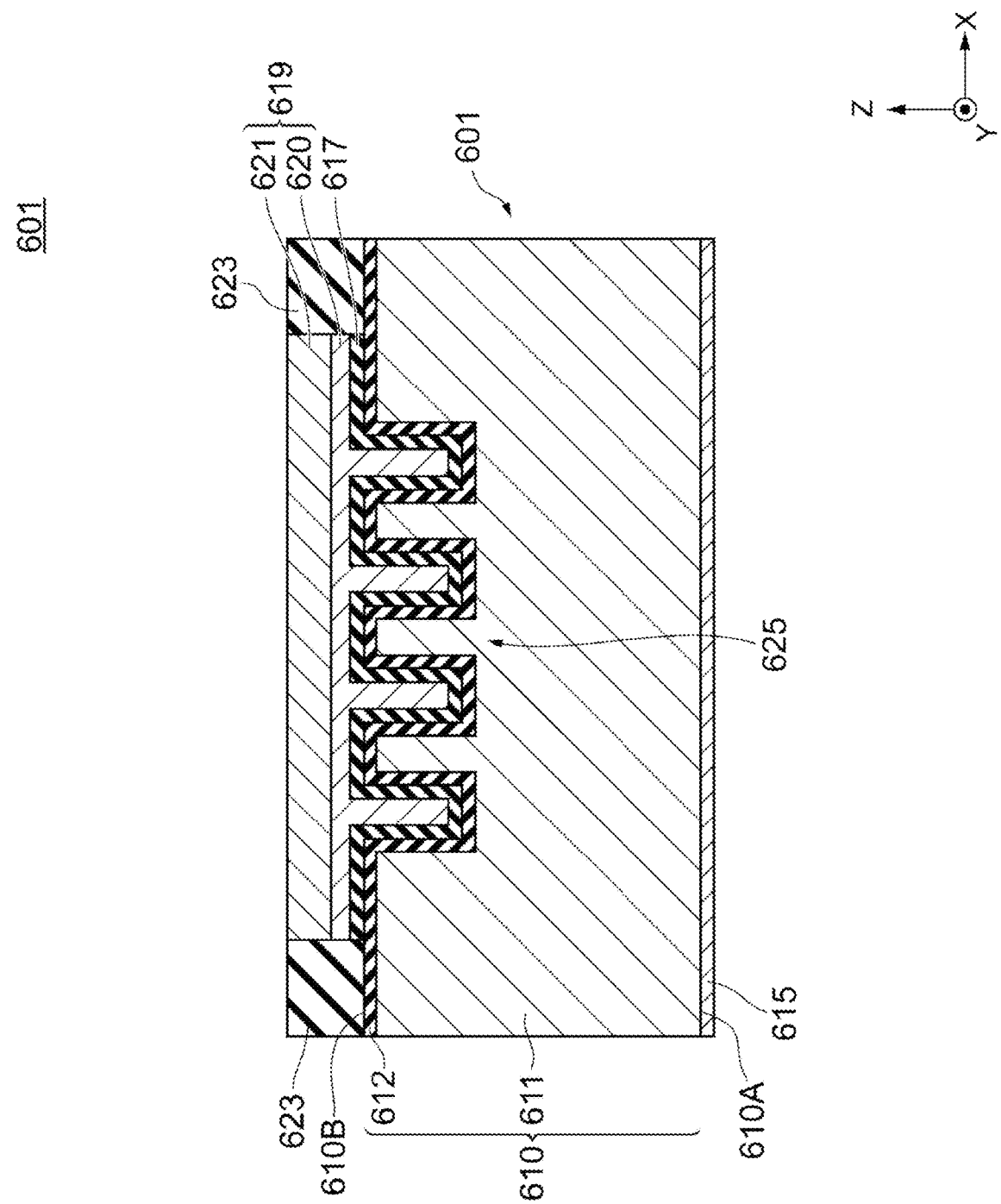
FIG. 10 is a plan view schematically illustrating a configuration of a first capacitor layer of a capacitor according to a sixth exemplary embodiment.

Next, a configuration of a first capacitor layer 601 of a capacitor according to a sixth exemplary embodiment will be described with reference to FIG. 10. FIG. 10 is a cross-sectional view schematically illustrating a configuration of a first capacitor layer of the capacitor according to the sixth embodiment.

The first capacitor layer 601 of the sixth embodiment is different from the first capacitor layer 101 of the first embodiment illustrated in FIG. 3 in that the connection electrode is omitted, and a second electrode 619 is not covered with a protective insulating film 623. Specifically, a surface of the second electrode 619 is adjacent to a surface of the protective insulating film 623 in plan view from a normal direction of a second main surface 610B, and the surface of the second electrode 619 is exposed.

Seventh Embodiment

Figure 11:
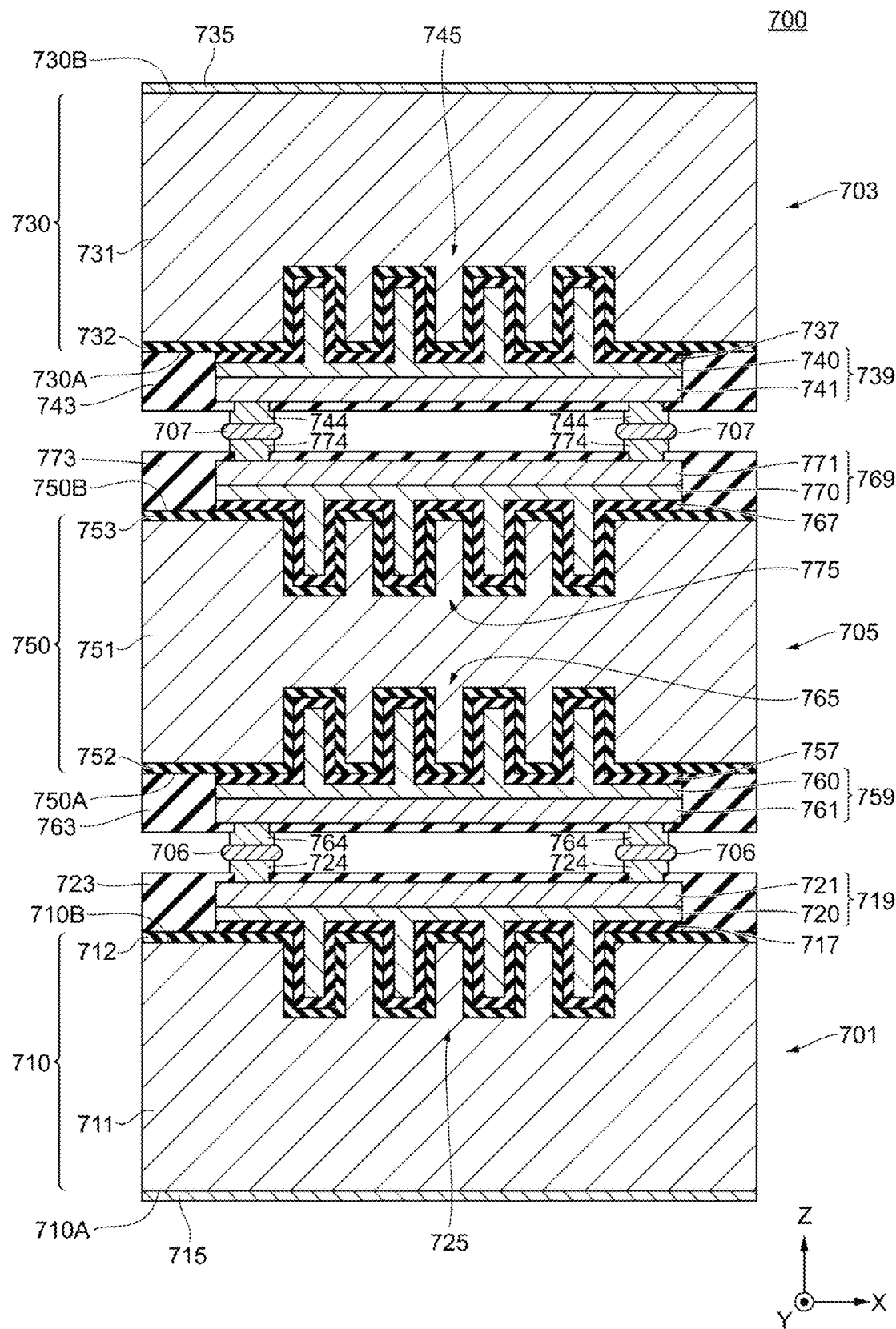
FIG. 11 is a cross-sectional view schematically illustrating a configuration of a capacitor according to a seventh exemplary embodiment.

Next, a configuration of a capacitor 700 according to a seventh exemplary embodiment will be described with reference to FIG. 11. FIG. 11 is a cross-sectional view schematically illustrating a configuration of a capacitor according to a seventh embodiment.

The capacitor 700 includes a first capacitor layer 701, a second capacitor layer 703, and an intermediate capacitor layer 705 overlapping in the third direction Z. The intermediate capacitor layer 705 is located between the first capacitor layer 701 and the second capacitor layer 703. The first capacitor layer 701 and the second capacitor layer 703 have similar configurations to those of the first embodiment, and thus the description thereof is omitted.

As further shown, the intermediate capacitor layer 705 includes a third substrate 750, a fifth dielectric film 752, a sixth dielectric film 757, a fifth electrode 759, a seventh dielectric film 753, an eighth dielectric film 767, a sixth electrode 769, protective insulating films 763, 773, and connection electrodes 764, 774. In respective portions of the intermediate capacitor layer 705, similar configurations to the respective portions of the first capacitor layer 101 and the second capacitor layer 103 described in the first embodiment are described as similar ones, and descriptions thereof are omitted as appropriate.

Moreover, the third substrate 750 includes a fifth main surface 750A and a sixth main surface 750B opposing each other in the third direction Z. The fifth main surface 750A is located on a side opposing the first capacitor layer 701, and a third trench structure 765 is formed in a center portion of the fifth main surface 750A. The sixth main surface 750B is located on a side opposing the second capacitor layer 703, and a fourth trench structure 775 is formed in a center portion of the sixth main surface 750B. The third substrate 750 has, for example, a silicon substrate 751, a fifth dielectric film 752, and a seventh dielectric film 753.

The fifth dielectric film 752 is located on a side of the silicon substrate 751 opposing the first capacitor layer 701, and forms the fifth main surface 750A. The seventh dielectric film 753 is located on a side of the silicon substrate 751 opposing the second capacitor layer 703, and forms the sixth main surface 750B. The silicon substrate 751 has a similar configuration to the silicon substrate 111, and the fifth dielectric film 752 and the seventh dielectric film 753 have similar configurations to the first dielectric film 112. The third trench structure 765 and the fourth trench structure 775 have similar configurations to the second trench structure 145 and the first trench structure 125, respectively.

The sixth dielectric film 757 is provided under the fifth main surface 750A (a side of the fifth dielectric film 752 opposing the first capacitor layer 701) and in a trench portion of the third trench structure 765, and is provided between the third substrate 750 and the fifth electrode 759. The sixth dielectric film 757 extends to an outside of the third trench structure 765 in plan view from a normal direction (the negative direction side in the third direction Z) of the fifth main surface 750A.

The fifth electrode 759 is provided under the sixth dielectric film 757 (a side of the sixth dielectric film 757 opposing the first capacitor layer 701) and in a trench portion of the third trench structure 765. In addition, the fifth electrode 759 extends to the outside of the third trench structure 765 in plan view from the normal direction of the fifth main surface 750A.

The eighth dielectric film 767 is provided on the sixth main surface 750B (a side of the seventh dielectric film 753 opposing the second capacitor layer 703) and in a trench portion of the fourth trench structure 775, and is provided between the third substrate 750 and the sixth electrode 769. The eighth dielectric film 767 extends to an outside of the fourth trench structure 775 in plan view from a normal direction (the positive direction side in the third direction Z) of the sixth main surface 750B. The sixth dielectric film 757 and the eighth dielectric film 767 have similar configurations to the fourth dielectric film 137 and the second dielectric film 117, respectively.

The sixth electrode 769 is provided on the eighth dielectric film 767 (a side of the eighth dielectric film 767 opposing the second capacitor layer 703) and in the trench portion of the fourth trench structure 775. Further, the sixth electrode 769 extends to the outside of the fourth trench structure 775 in plan view from the normal direction of the sixth main surface 750B. The sixth electrode 769 is electrically separated from the fifth electrode 759 and opposes the fifth electrode 759 in the third direction Z. In addition, the fifth electrode 759 and the sixth electrode 769 have similar configurations to the third electrode 139 and the second electrode 119, respectively.

The protective insulating film 763 covers the fifth electrode 759. The protective insulating film 773 covers the sixth electrode 769. The connection electrode 764 is provided to penetrate the protective insulating film 763 and is electrically connected to the fifth electrode 759. The connection electrode 774 is provided to penetrate the protective insulating film 773 and is electrically connected to the sixth electrode 769. It should be appreciated that the protective insulating film 763 and the protective insulating film 773 can have similar configurations to the protective insulating film 143 and the protective insulating film 123, respectively. The connection electrode 764 and the connection electrode 774 have similar configurations to the connection electrode 144 and the connection electrode 124, respectively.

In the example illustrated in FIG. 11, the connection electrode 724 and the connection electrode 764 are electrically connected by a brazing member 706 because there is only one intermediate capacitor layer. Further, the connection electrode 774 and the connection electrode 744 are electrically connected by a brazing member 707. That is, the second electrode 719 and the fifth electrode 759 are electrically connected, and the sixth electrode 769 and the third electrode 739 are electrically connected. However, the intermediate capacitor layer is not limited to one layer, and two or more layers thereof may be provided. When multiple intermediate capacitor layers are provided, each intermediate capacitor is similarly configured.

As described above, according to an exemplary aspect, a capacitor is provided that includes a first capacitor layer 101 having a first substrate 110 that has a first main surface 110A and a second main surface 110B opposing each other and is provided with a first trench structure 125 having a trench portion 126 in the second main surface 110B, a first electrode 115 provided on a side of the first main surface 110A of the first substrate 110, and a second electrode 119 provided in a region of the first trench structure 125 that includes the trench portion 126 on a side of the second main surface 110B of the first substrate 110, and a second capacitor layer 103 having a second substrate 130 that has a third main surface 130A and a fourth main surface 130B opposing each other, a third electrode 139 provided on a side of the third main surface 130A of the second substrate 130, and a fourth electrode 135 provided on a side of the fourth main surface 130B of the second substrate 130, wherein the first capacitor layer 101 and the second capacitor layer 103 are disposed such that the second electrode 119 and the third electrode 139 oppose each other and are electrically connected.

As described above, according to an exemplary aspect, since the capacitor has the first and second capacitor layers connected in series, a withstand voltage of the capacitor in a base member can be improved. In addition, a fourth electrode functioning as a bonding pad is provided on the fourth main surface opposite to the third main surface having the second trench structure with respect to a base material. Therefore, it is possible to disperse a stress applied to the trench structure when a wire is bonded to the capacitor, and to suppress damage to the trench structure due to an external stress. Bonding can be performed while suppressing damage to the trench structure even if a pressure during bonding of a Cu wire or a thick wire, which is preferably used for bonding when a capacitor is applied to a power device, is high. In addition, since a junction point of the bonding and the trench structure may overlap in plan view, an area occupied by the capacitor in the base member can be reduced.

According to an exemplary aspect, the first capacitor layer 101 further includes a second dielectric film 117 located between the first substrate 110 and the second electrode 119 and provided in the region including the trench portion 126. With this configuration, a dielectric constant between the first electrode and the second electrode can be controlled, and a capacitance value of the capacitor can be adjusted. For example, the capacitance value of the capacitor can be improved by using a dielectric having a high dielectric constant as the first dielectric film. In addition, even in a case where the first substrate or a part thereof is formed of a conductive material, such as n-Si or p-Si, and functions as a first electrode, it is possible to prevent an electrical short circuit and form a capacitance between the first electrode and the second electrode. Further, in the capacitor, a plurality of capacitor layers are connected in series, and thus it is not necessary to increase a thickness of the dielectric film for the purpose of improving the withstand voltage. Therefore, it is possible to suppress generation of a crack due to a tensile stress of the dielectric film to the substrate, and to suppress damage to the trench structure.

According to an exemplary aspect, the first capacitor layer 101 further has a protective insulating film 123 covering at least the second dielectric film 117. With this configuration, even when a high voltage is applied to the capacitor, creeping discharge at an end of the dielectric film or a surface of the second main surface can be suppressed. That is, the withstand voltage of the capacitor can be increased.

According to another exemplary aspect, a dielectric constant of the protective insulating film 123 is higher than a dielectric constant of the second dielectric film 117. With this configuration, even when a high voltage is applied to the capacitor, it is possible to suppress a leakage electric field from the second electrode. That is, the withstand voltage of the capacitor can be increased.

According to another exemplary aspect, the dielectric constant of the protective insulating film 123 is lower than the dielectric constant of the second dielectric film 117. With this configuration, it is possible to suppress formation of parasitic capacitance by the second electrode. That is, an error of the capacitance value of the capacitor can be reduced.

According to yet another exemplary aspect, the protective insulating film 123 is configured to reduce a tensile stress or a compressive stress on the first substrate 110 in the second dielectric film 117. With this configuration, damage to the first trench structure due to an internal stress of the capacitor can be suppressed.

According to another exemplary aspect, the first capacitor layer 101 further has a connection electrode 124 electrically connected to the second electrode 119, the second capacitor layer 103 further has a connection electrode 144 electrically connected to the third electrode 139, and the second electrode 119 and the third electrode 139 are electrically connected to each other by the connection electrode 124 and the connection electrode 144. With intervention by the connection electrodes, when the second electrode and the third electrode are electrically connected, a possibility of damage to the second electrode or the third electrode by coming into contact with another member can be reduced.

According to another exemplary aspect, the connection electrode 124 of the first capacitor layer 101 is disposed outside the region of the first trench structure 125 in plan view from a normal direction of the second main surface 110B. With this configuration, it is possible to reduce a stress applied to the trench portion via the connection electrode 124 at a time of bonding to the fourth electrode, and to suppress damage to the first trench structure.

According to another exemplary aspect, the connection electrode 124 of the first capacitor layer 101 is provided in a frame shape so as to surround the region of the first trench structure 125 in plan view from the normal direction of the second main surface 110B. With this configuration, conductivity between the second electrode and the third electrode can be improved by enlarging an area of the connection electrode in plan view.

According to another exemplary aspect, the connection electrode 224 of the first capacitor layer 201 is provided in a plurality of island shapes so as to surround the region of the first trench structure 225 in plan view from the normal direction of the second main surface 210B. With this configuration, in addition to that similar effects to those described above can be obtained, the region of the trench structure 125 surrounded by the connection electrode is isolated from the outside and, for example, breakage of the connection electrode due to an internal pressure increase due to a temperature rise, and the like can be suppressed.

According to yet another exemplary aspect, the first capacitor layer 401 has a plurality of connection electrodes 424, and at least one of the plurality of connection electrodes 424 of the first capacitor layer 401 is disposed inside the region of the first trench structure 425 in plan view from a normal direction of the second main surface 410B, and is provided so as to overlap a region of the first trench structure 425 that avoids the trench portion 426. With this configuration, it is possible to obtain similar effects to those described above. In addition, since the connection electrodes can be disposed to be dispersed in a surface direction of a surface of the second electrode, even if a part of the connection electrode has a contact failure, conductivity can be ensured between the second electrode and the third electrode. Furthermore, compared to a case where the connection electrode is provided only in the peripheral portion of the element, a pressure at a time of bonding can be dispersed more, and a capacitor with higher reliability can be provided.

According to another exemplary aspect, the second substrate 130 is provided with a second trench structure 145 having a trench portion in the third main surface 130A, the third electrode 139 is provided in a region of the second trench structure 145 that includes the trench portion on the side of the third main surface 130A of the second substrate 130, and the first capacitor layer 101 and the second capacitor layer 103 are disposed such that the first trench structure 125 and the second trench structure 145 oppose each other. With this configuration, the capacitor can increase the capacitance density of the second capacitor layer and can improve the capacitance value. Even if a trench structure is provided in the main surfaces on mutually opposing sides of the first capacitor layer and the second capacitor layer, the main surface directly receiving a pressure at a time of bonding is flat. Thus, the capacitor can reduce a stress applied to the trench portion at a time of bonding, and can suppress damage to the first trench structure and the second trench structure.

As described above, according to another exemplary aspect, a capacitor is provided that includes a first capacitor layer 701, a second capacitor layer 703, and at least one intermediate capacitor layer 705 located between the first capacitor layer 701 and the second capacitor layer 703. In this aspect, the first capacitor layer 701 includes a first substrate 710 that has a first main surface 710A and a second main surface 710B opposing each other and is provided with a first trench structure 725 having a trench portion in the second main surface 710B, a first electrode 715 provided on a side of the first main surface 710A of the first substrate 710, and a second electrode 719 provided in a region of the first trench structure 725 that includes the trench portion on a side of the second main surface 710B of the first substrate 710. Moreover, the second capacitor layer 703 includes a second substrate 730 that has a third main surface 730A and a fourth main surface 730B opposing each other and is provided with a second trench structure 745 having a trench portion in the third main surface 730A, a third electrode 739 provided in a region of the second trench structure 745 that includes the trench portion on a side of the third main surface 730A of the second substrate 730, and a fourth electrode 735 provided on a side of a fourth main surface 73B of the second substrate 730. Yet further, the intermediate capacitor layer 705 includes a third substrate 750 that has a fifth main surface 750A and a sixth main surface 750B opposing each other and is provided with a third trench structure 765 having a trench portion in the fifth main surface 750A and is provided with a fourth trench structure 775 having a trench portion in the sixth main surface 750B, a fifth electrode 759 provided in a region of the third trench structure 765 that includes the trench portion on a side of the fifth main surface 750A of the third substrate 750, and a sixth electrode 769 provided in a region of the fourth trench structure 775 that includes the trench portion on a side of the sixth main surface 750B of the third substrate 750. According to the exemplary aspect, the first capacitor layer 701 and the intermediate capacitor layer 705 are disposed such that the first trench structure 725 and the third trench structure 765 oppose each other, and the second capacitor layer 703 and the intermediate capacitor layer 705 are disposed such that the second trench structure 745 and the fourth trench structure 775 oppose each other.

With this configuration, it is possible to obtain similar effects to those described above. Further, by increasing the number of intermediate capacitor layers, the capacitor withstand voltage can be improved.

As described above, according to exemplary aspects of the present invention, a capacitor can be provided that is configured for suppressing deterioration of electrical characteristics and reliability.

It is noted that each of the above-described exemplary embodiments is intended to facilitate understanding of the present invention and is not intended to be construed as limiting the present invention. The present invention can be modified/improved without departing from the spirit of the present invention, and equivalents thereof are also included in the present invention. That is, those in which design modifications are appropriately made to each embodiment by those skilled in the art are also included in the scope of the present invention as long as they have the features of the present invention. For example, the elements included in each embodiment and arrangements, materials, conditions, shapes, sizes, and so on thereof are not limited to those exemplified and can be appropriately changed. Further, the elements included in each embodiment can be combined as much as technically possible, and combinations of these are included in the scope of the present invention as long as they include the features of the present invention.

DESCRIPTION OF REFERENCE SYMBOLS

100: capacitor
101: first capacitor layer
110: first substrate
111: silicon substrate
112: first dielectric film
110A: first main surface
110B: second main surface
115: first electrode
117: second dielectric film
119: second electrode
120: first conductive film
121: second conductive film
123: protective insulating film
124: connection electrode
103: second capacitor layer
130: second substrate
131: silicon substrate
132: third dielectric film
130A: third main surface
130B: fourth main surface
139: third electrode
140: third conductive film
141: fourth conductive film
137: dielectric film
135: fourth electrode
143: protective insulating film
144: connection electrode
102: brazing member

The invention claimed is:

1. A capacitor comprising:
a first capacitor layer having:
a first substrate with first and second main surfaces that oppose each other and a first trench structure with a trench extending in the second main surface;
a first electrode disposed on a side of the first main surface of the first substrate;
a second electrode disposed in a region of the first trench structure on a side of the second main surface of the first substrate;
a first connection electrode electrically connected to the second electrode and that is disposed outside a region of the first trench structure in a direction parallel to the second main surface, and
a second capacitor layer having:
a second substrate with third and fourth main surfaces that oppose each other;
a third electrode disposed on a side of the third main surface of the second substrate;
a fourth electrode disposed on a side of the fourth main surface of the second substrate; and
a second connection electrode electrically connected to the third electrode and that is disposed outside the region of the first trench structure in the direction parallel to the second main surface,
wherein the first and second capacitor layers are disposed such that the second electrode and the third electrode oppose each other, and
wherein the respective first and second connection electrodes electrically connect the second electrode to the third electrode.

2. The capacitor according to claim 1, wherein the second electrode faces the third electrode in a thickness direction of the capacitor.

3. The capacitor according to claim 1, wherein the first capacitor layer further includes a dielectric film disposed between the first substrate and the second electrode and is disposed at least partially in the trench of the first trench structure.

4. The capacitor according to claim 3, wherein the first capacitor layer further includes a protective insulating film that covers at least the dielectric film.

5. The capacitor according to claim 4, wherein the protective insulating film has a dielectric constant that is higher than a dielectric constant of the dielectric film.

6. The capacitor according to claim 4, wherein the protective insulating film comprises a dielectric constant that is lower than a dielectric constant of the dielectric film.

7. The capacitor according claim 4, wherein the protective insulating film is configured to reduce a tensile stress or a compressive stress on the first substrate in the dielectric film.

8. The capacitor according to claim 1, wherein the connection electrode of the first capacitor layer is disposed in a frame shape so as to surround the region of the first trench structure in a plan view from a direction normal to the second main surface.

9. The capacitor according to claim 1, wherein the connection electrode of the first capacitor layer is disposed in a plurality of island shapes so as to surround the region of the first trench structure in a plan view from a direction normal to the second main surface.

10. The capacitor according to claim 1,
wherein the first capacitor layer has a plurality of the connection electrodes, and
wherein at least one of the plurality of connection electrodes of the first capacitor layer is disposed inside the region of the first trench structure in a plan view from a direction normal to the second main surface and overlaps a region of the first trench structure that avoids the trench.

11. A capacitor according to claim 1,
wherein the second substrate includes a second trench structure with a trench portion extending in the third main surface,
wherein the third electrode is disposed in a region of the second trench structure that on the side of the third main surface of the second substrate, and
wherein the first trench structure of the first capacitor layer opposes the second trench structure of the second capacitor layer.

12. The capacitor according to claim 1, wherein the first and second substrates comprise a silicon substrate.

13. A capacitor comprising:
a pair of opposing capacitor layers that face each other, with each capacitor layer having a substrate and a trench structure with at least one trench extending in the respective substrate away from the opposing capacitor layer;
a pair of external electrodes disposed on outer main surfaces of the pair of capacitor layers, respectively;
a pair of inner electrodes disposed in regions of the trench structures of the pair of capacitor layers, respectively, with the pair of inner electrodes opposing each other and electrically connected to each other in a thickness direction of the capacitor
a plurality of connection electrodes that physically and electrically connect the pair of inner electrodes to each other,
wherein each of the plurality of connection electrodes are disposed outside a region of the trench structures in a direction parallel to the outer main surfaces.

14. The capacitor according to claim 13, wherein at least one of the plurality of connection electrodes is disposed in a frame shape so as to surround a region of at least one of the trench structures in a plan view from a direction normal to the outer main surfaces.

15. The capacitor according to claim 13, wherein the plurality of connection electrodes are disposed in a plurality of island shapes so as to surround a region of the trench structures in a plan view from a direction normal to the outer main surfaces.

16. The capacitor according to claim 13, wherein at least one of the plurality of connection electrodes is disposed inside a region of the trench structures in a plan view from a direction normal to the outer main surfaces and overlaps the region of the first trench structure that avoids the at least one trench of the first trench structure.

17. The capacitor according to claim 13, wherein the respective substrates of each capacitor layer comprises a silicon substrate.

* * * * *